(12) United States Patent
Yang

(10) Patent No.: US 10,884,851 B2
(45) Date of Patent: Jan. 5, 2021

(54) METHOD FOR ACCESSING FLASH MEMORY MODULE AND ASSOCIATED FLASH MEMORY CONTROLLER AND ELECTRONIC DEVICE

(71) Applicant: Silicon Motion Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 135 days.

(21) Appl. No.: 16/056,555

(22) Filed: Aug. 7, 2018

(65) Prior Publication Data
US 2019/0294499 A1 Sep. 26, 2019

(30) Foreign Application Priority Data
Mar. 20, 2018 (TW) .............................. 107109497 A

(51) Int. Cl.
| | | |
|---|---|---|
| *G06F 11/10* | (2006.01) | |
| *G11C 29/52* | (2006.01) | |
| *G11C 16/10* | (2006.01) | |
| *G11C 16/04* | (2006.01) | |

(52) U.S. Cl.
CPC .......... *G06F 11/1068* (2013.01); *G11C 16/10* (2013.01); *G11C 29/52* (2013.01); *G11C 16/0483* (2013.01)

(58) Field of Classification Search
CPC ............. G06F 11/1068; G06F 11/1004; G06F 11/1012; G11C 16/10; G11C 29/52; G11C 16/0483; G11C 2029/0411; G11C 29/028; G11C 29/44; G11C 29/42; H03M 13/09; H03M 13/13; H03M 13/2906
USPC ......................................................... 714/764
See application file for complete search history.

(56) References Cited

U.S. PATENT DOCUMENTS

| | | | |
|---|---|---|---|
| 4,712,215 A | 12/1987 | Joshi | |
| 6,553,511 B1 * | 4/2003 | DeKoning | .......... G06F 11/1076 707/999.1 |
| 7,055,085 B2 | 5/2006 | McDaniel | |
| 9,563,382 B2 * | 2/2017 | Hahn | ..................... G06F 3/0631 |
| 10,248,345 B1 * | 4/2019 | Dickson | ................ G06F 3/0622 |
| 10,353,775 B1 * | 7/2019 | Yen | ..................... G06F 11/1096 |
| 2003/0145270 A1 * | 7/2003 | Holt | .................... G06F 11/1076 714/766 |
| 2009/0268656 A1 * | 10/2009 | Yousef | ............... H04N 21/2362 370/315 |

(Continued)

FOREIGN PATENT DOCUMENTS

CN 1266316 A 9/2000

*Primary Examiner* — James C Kerveros
(74) *Attorney, Agent, or Firm* — Winston Hsu

(57) ABSTRACT

The present invention provides a method for accessing a flash memory module, wherein the method comprises: receiving data and a corresponding metadata from a host device; performing a CRC operation upon the data to generate a CRC code; encoding the metadata and the CRC code to generate an adjusted parity code; encoding the data and the adjusted parity code to generate encoded data, wherein the encoded data comprises the data, the adjusted parity code and an error correction code corresponding to the data and the adjusted parity code; and writing the encoded data and the metadata to a page of a block of a flash memory module.

20 Claims, 7 Drawing Sheets

(56) References Cited

U.S. PATENT DOCUMENTS

| | | | |
|---|---|---|---|
| 2009/0271532 A1 | 10/2009 | Allison | |
| 2013/0007562 A1* | 1/2013 | Fai | G06F 11/1004 |
| | | | 714/758 |
| 2014/0122963 A1* | 5/2014 | Motwani | H03M 13/2927 |
| | | | 714/758 |
| 2015/0301933 A1* | 10/2015 | Tuers | G06F 12/0246 |
| | | | 714/773 |
| 2016/0026406 A1* | 1/2016 | Hahn | G06F 3/0631 |
| | | | 711/103 |
| 2017/0033806 A1* | 2/2017 | Arslan | H03M 13/356 |
| 2018/0102182 A1* | 4/2018 | Zhou | G06F 11/1068 |
| 2019/0140659 A1* | 5/2019 | Kim | H03M 13/1111 |

* cited by examiner

METHOD FOR ACCESSING FLASH MEMORY MODULE AND ASSOCIATED FLASH MEMORY CONTROLLER AND ELECTRONIC DEVICE

BACKGROUND OF THE INVENTION

1. Field of the Invention

The present invention relates to a flash memory, and more particularly to a method of accessing a flash memory module.

2. Description of the Prior Art

When a flash memory controller writes the data from a host device to a page in the flash memory module, the flash memory controller simultaneously writes the metadata corresponding to the data in a spare area of the page for the following reference. The metadata can be generated by the flash memory controller or provided by the host device. However, when the metadata is provided by the host device, the metadata may be temporarily stored in the static random access memory (SRAM) and external Dynamic Random Access Memory (DRAM) of the flash memory controller during the stages of the metadata being written to the page, and thus the data of the metadata may have errors in the stages, and it will make wrong content written to the page and make trouble for the data reading afterwards.

SUMMARY OF THE INVENTION

Therefore, one of the objectives of the present invention is to provide a method for accessing a flash memory module, which can protect metadata from the host device so as to avoid the problem of metadata error caused by accessing the SRAM or DRAM as described in the prior art.

According to a first aspect of the present invention, an exemplary method for accessing a flash memory module is disclosed. The method comprises the following steps: receiving a data and a corresponding metadata from a host device; performing a cyclic redundancy check (CRC) operation upon the data to generate a CRC code; encoding the metadata and the CRC code to generate an adjusted parity code; encoding the data and the adjusted parity code to generate encoded data, wherein the encoded data comprises the data, the adjusted parity code and an error correction code corresponding to the data and the adjusted parity code; and writing the encoded data and the metadata to a page of a block of the flash memory module.

According to a second aspect of the present invention, an exemplary flash memory controller is disclosed, wherein the flash memory controller is utilized to access a flash memory module, and the flash memory controller comprises: a read-only memory (ROM), a microprocessor, and a plurality of codecs, wherein the ROM is utilized to store a code, and the microprocessor is utilized to execute the code to control access to the flash memory module. In the operation of the flash memory controller, when the flash memory controller receives a data and a corresponding metadata from a host device, the plurality of codecs perform a CRC operation upon the data to generate a CRC code, and encodes the metadata and the CRC code to generate an adjusted parity code, and encodes the data and the adjusted parity code to generate encoded data, wherein the encoded data comprises the data, the adjusted parity code and an error correction code corresponding to the data and the adjusted parity code; and the microprocessor writes the encoded data and the metadata to a page of a block of the flash memory module.

According to a third aspect of the present invention, an exemplary electronic device is disclosed. The electronic device comprises: a flash memory module and a flash memory controller. When the flash memory controller receives a data and a corresponding metadata from a host device, the plurality of codecs perform a CRC operation upon the data to generate a CRC code, and encodes the metadata and the CRC code to generate an adjusted parity code, and encodes the data and the adjusted parity code to generate encoded data, wherein the encoded data comprises the data, the adjusted parity code and an error correction code corresponding to the data and the adjusted parity code; and the microprocessor writes the encoded data and the metadata to a page of a block of the flash memory module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
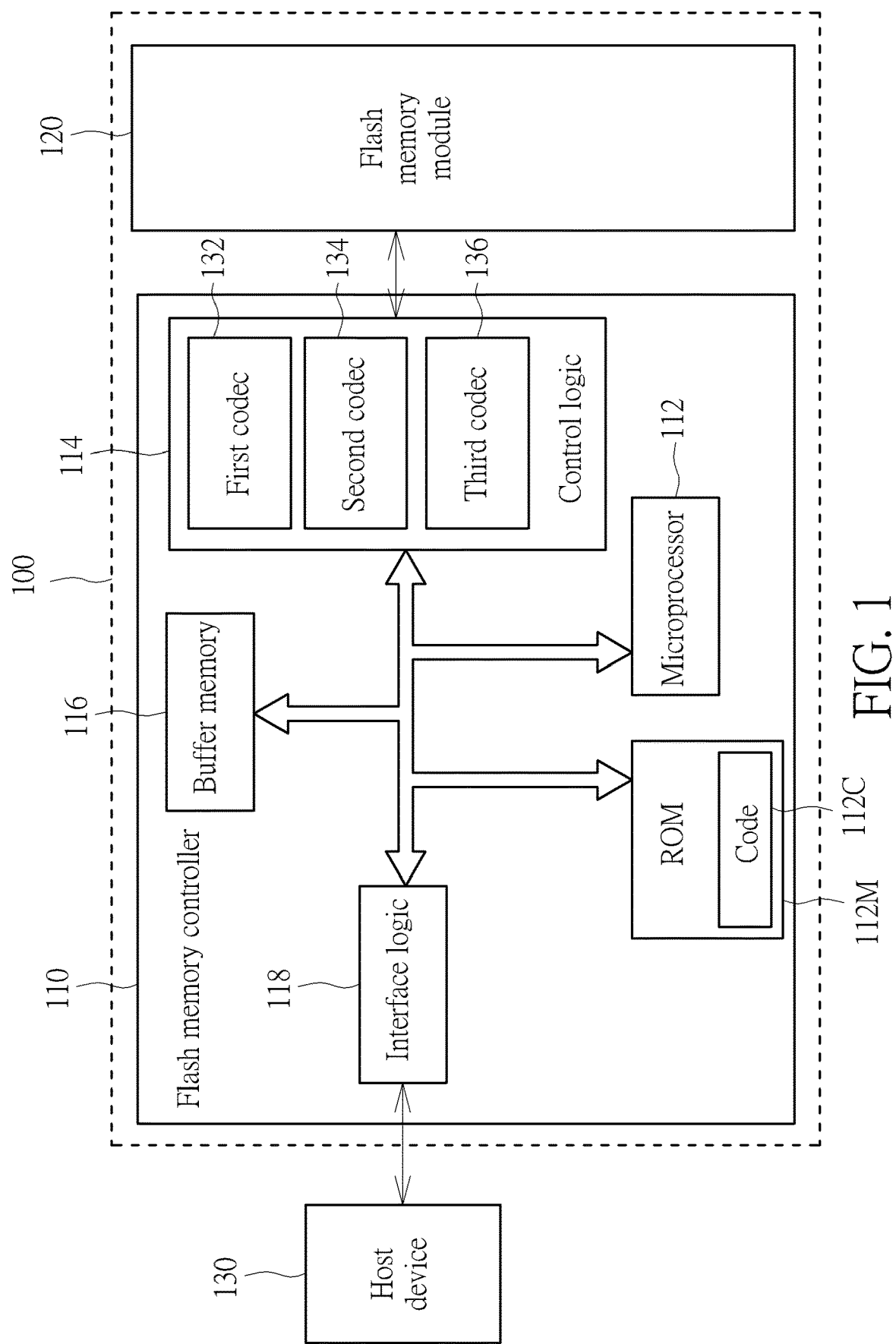
FIG. 1 is a diagram illustrating a memory device according to an embodiment of the present invention.

Please refer to FIG. 1. FIG. 1 is a diagram illustrating a memory device 100 according to an embodiment of the present invention. The memory device 100 comprises a flash memory module 120 and a flash memory controller 110, and the flash memory controller 110 is utilized to access the flash memory module 120. According to this embodiment, the flash memory controller 110 comprises a microprocessor 112, a read-only memory (ROM) 112M, a control logic 114, a buffer memory 116, and an interface logic 118. The ROM 112M is utilized to store a code 112C, and the microprocessor 112 is utilized to execute the code 112C to control the access to the flash memory module 120. The control logic 114 comprises a first codec 132, a second codec 134, and a third codec 136. In the present embodiment, the first codec 132 is utilized to perform a Cyclic redundancy check (CRC) operation, and the second codec 134 is utilized to perform an exclusive-OR (XOR) operation, and the third codec 136 is utilized to perform a low-density parity-check code (LDPC code) operation, but the invention is not limited thereto.

In a typical situation, the flash memory module 120 comprises a plurality of flash memory chips, and each flash memory chip comprises a plurality of blocks, and the data erasing operation for the flash memory module 120 by the controller (e.g., the flash memory controller 110 executing the code 112C via the microprocessor 112) is performed in units of blocks. In addition, a block may record a specific number of data pages (data pages) in which the data writing operation for the flash memory module 120 by the controller (e.g., the flash memory controller 110 executing the code 112C via the microprocessor 112) is performed to write in units of data pages. In this embodiment, the flash memory module 120 is a three-dimensional NAND type flash memory (3D NAND-type flash).

In practice, the flash memory controller 110 executing the code 112C via the microprocessor 112, can perform a number of control operations by using its own internal components, such as controlling the flash memory module 120 by using the control logic 114 (especially the access operations for at least one block or at least one data page), buffering the required buffering operations by using the buffer memory 116, and using the interface logic 118 to communicate with a host device 130. The buffer memory 116 is implemented in a random access memory (RAM). For example, the buffer memory 116 can be a static random access memory (SRAM), but the present invention is not limited thereto.

In an embodiment, the memory device 100 can be a portable memory device (e.g., a memory card that complies with to the SD/MMC, CF, MS, XD standard), and the host device 130 can be an electronic device capable of connecting to the memory device, such as cell phones, laptops, desktops, etc. In another embodiment, the memory device 100 can be a solid-status hard disk or an embedded storage that complies with Universal Flash Storage (UFS) or Embedded Multi Media Card (EMMC) specification, which is provided in an electronic device, such as in a mobile phone, a notebook computer, a desktop computer, and the host device 130 can be a processor of the electronic device.

Figure 2:
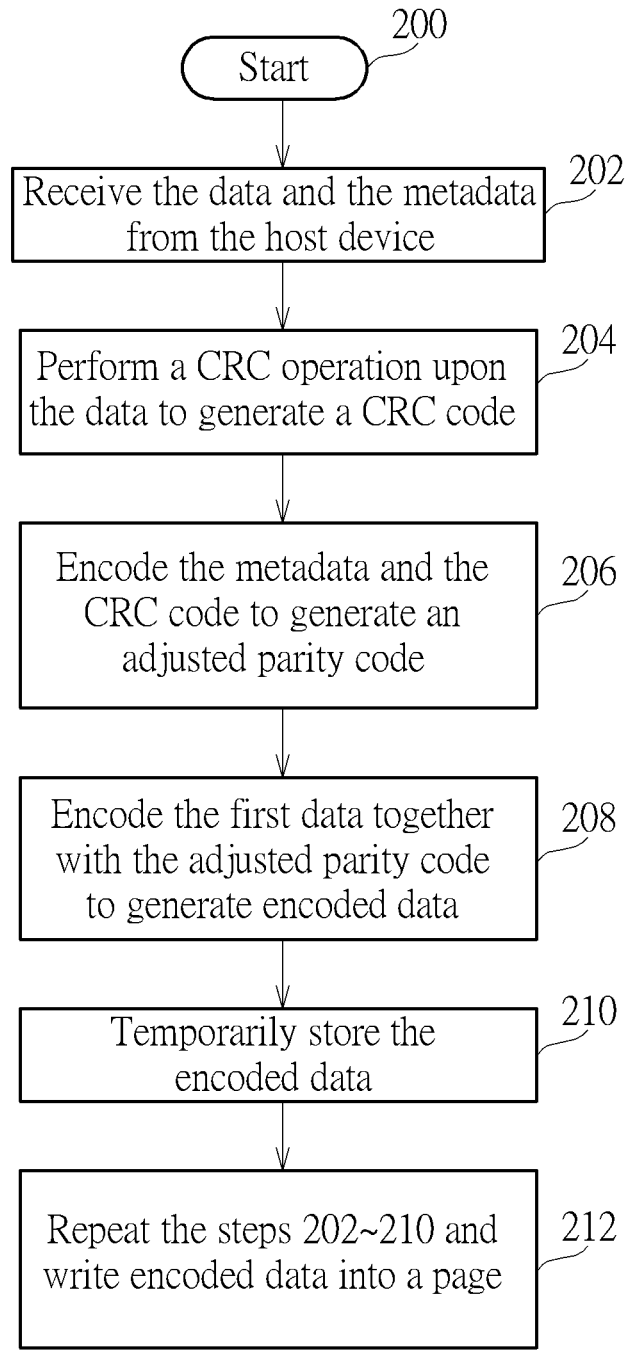
FIG. 2 is a flow chart of accessing the flash memory module 120 according to an embodiment of the present invention.
Figure 3:
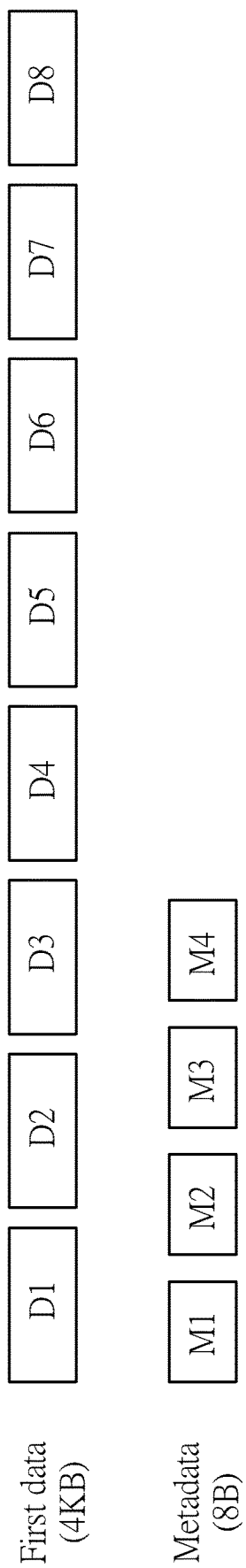
FIG. 3 is a schematic diagram of the first data and the corresponding metadata.

Please refer to FIG. 2. FIG. 2 is a flow chart of accessing the flash memory module 120 according to an embodiment of the present invention. In the step 200, the flow starts, and the flash memory controller 110 prepares the host device 130 to receive the data and store it in the flash memory module 120. In the step 202, the flash memory controller 110 receives the first data and the metadata corresponding to the first data from the host device 130. The metadata may comprise identification (ID) information, hash data, Quality of Service (QoS) information of the data, or other management information, such as logical addresses and management information other than the data itself, etc. Please refer to FIG. 3. In this embodiment, the size of the first data is 4 kilobytes (KB), and the metadata is 8 bytes. In the following operations of the present embodiment, the data is divided into eight portions D1-D8 with a size of 512 bytes, and the metadata is divided into four portions M1-M4 with a size of 2 bytes.

Figure 4:
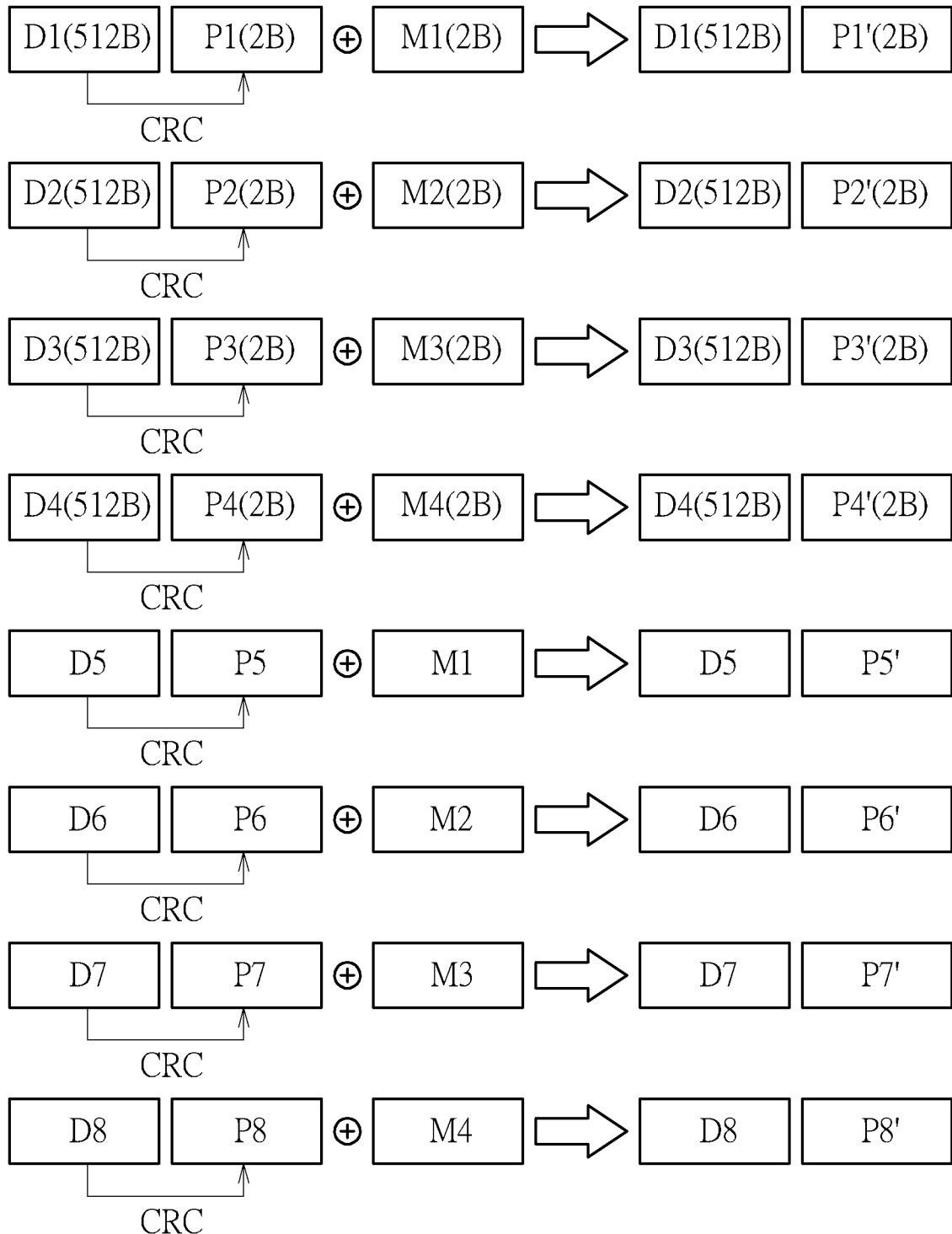
FIG. 4 is a schematic diagram of a CRC operation and an XOR operation according to an embodiment of the present invention.

In the step 204, the first codec 132 performs a CRC operation upon the first data to generate a CRC code, and in the step 206, the second codec 134 encodes the metadata and the CRC code to generate an adjusted parity code. Specifically, please refer to FIG. 4. The first codec 132 first performs the CRC operation upon the eight portions D1-D8 of the first data to generate a plurality of CRC codes P1-P8, wherein the size of each CRC code P1-P8 is 2 bytes. After that, the second codec 134 further respectively performs an exclusive-OR (XOR) operation upon the CRC codes P1-P4 and the four portions M1-M4 of the metadata to generate the adjusted parity code P1'-P4', respectively, and the second codec 134 also respectively performs the XOR operation upon the CRC codes P5-P8 and the four portions M1-M4 of the metadata to generate the adjusted parity code P5'-P8', respectively.

It should be noted that the steps 204 and 206 are performed immediately after the flash memory controller 110 receives the first data and the metadata, and the first data and the metadata have not yet been stored in the buffer memory 116 and/or an external DRAM (not shown). The purpose of performing the CRC operation upon the first data in the step 204 is to avoid an error during the subsequent access to the buffer memory 116 and/or the external DRAM (that is, providing an end to end protection). In the step 206, the aim of performing the XOR operation upon the CRC codes P1-P4 and the four portions M1-M4 of the metadata is to allow the adjusted parity code P1'-P4' can also comprise the information content of the metadata. That is, the adjusted parity code P1'-P4' can protect the first data and the metadata at the same time.

In the step 208, the third codec 136 encodes the first data together with the adjusted parity code to generate encoded data. The encoded data comprises the first data, the adjusted parity code, and an error correction code (ECC) corresponding to the first data and the adjusted parity code. Specifically, please refer to FIG. 5. The third codec 136 encodes (LDPC-encodes) the four portions D1-D4 of the first data and the corresponding adjusted parity codes P1-P4' to generate an error correction code ECC1, and the four portions D1-D4 of the first data, the adjustment parity codes P1'-P4', and the error correction code ECC1 constitute an ECC chunk. The codec 136 also encodes the other four portions D5-D8 of the first data and the corresponding adjusted parity codes P5'-P8' to generate an error correction code ECC2, and the portions D5-D8 of the first four data, the adjusted parity codes P5'-P8', and the error correction code ECC2 constitute another ECC chunk.

Figure 5:
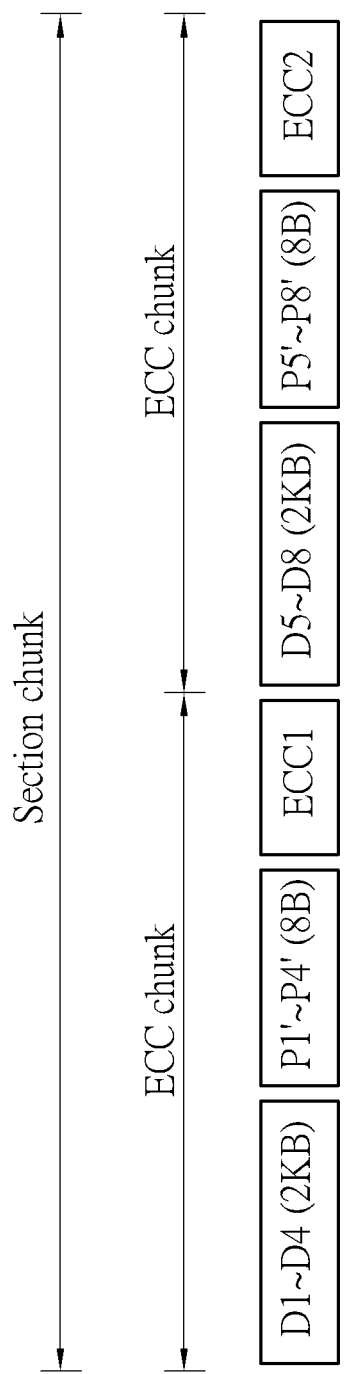
FIG. 5 is a schematic diagram of an ECC chunk and a section chunk according to an embodiment of the present invention.

In the step 210, the two ECC chunks shown in FIG. 5 form a section chunk and are temporarily stored in the buffer memory 116 and/or the external DRAM, wherein the above-mentioned section chunks are utilized to be stored in a section of a page.

In the step 212, assuming that the size of a page is 16 kilobytes, the flash memory controller 110 repeats the steps 202-210 to receive the second, third, fourth data and the corresponding metadata from the host device 130, and generates corresponding section chunks, and then writes the four section chunks together with the 32-byte metadata into a page of a block in the flash memory module 120, wherein the metadata is stored in the spare area of the page.

Figure 6:
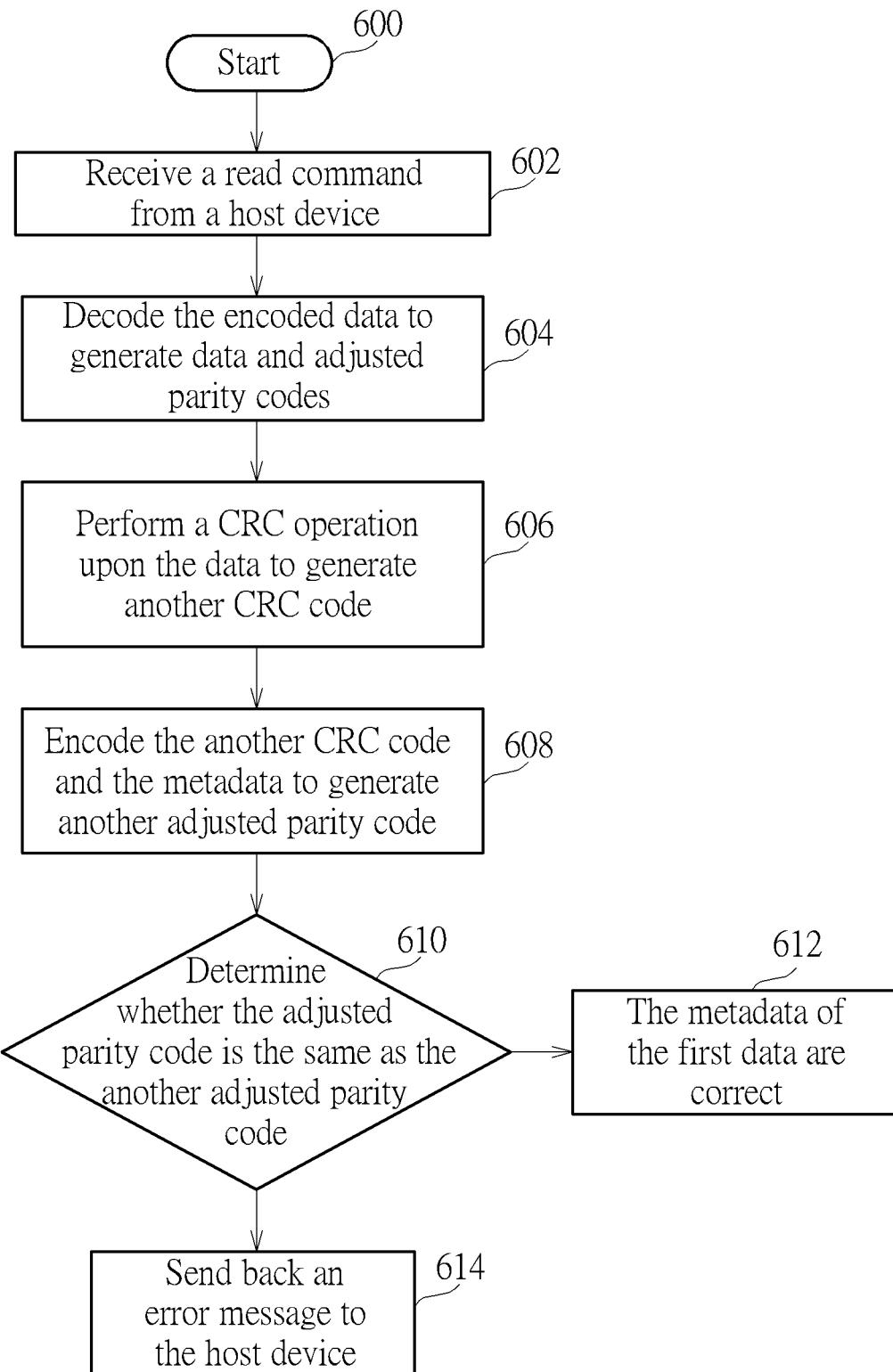
FIG. 6 is a flowchart of a method for reading the flash memory module according to an embodiment of the present invention.

Please refer to FIG. 6. FIG. 6 is a flow chart of a method for reading the flash memory module 120 according to an embodiment of the present invention. The flow of FIG. 6 is followed by the embodiments shown in FIGS. 2-5, that is, the flash memory controller 110 reads the page storing the four section chunks SC-SC4 and the metadata of 32-bytes. In the step 600, the flow starts, and the flash memory controller 110 receives a read command from the host device 130. In this embodiment, it is assumed that the read command requests to read the data of the section chunk SC1 and the corresponding metadata.

In the step 604, the third codec 136 decodes the first ECC chunk and the second ECC chunk in the section chunk SC1 to generate the four portions D1-D4 and the adjusted parity codes P1'-P4' of the first data and the another four portions D5-D8 and the adjusted parity codes P5'-P8' of the first data.

Figure 7:
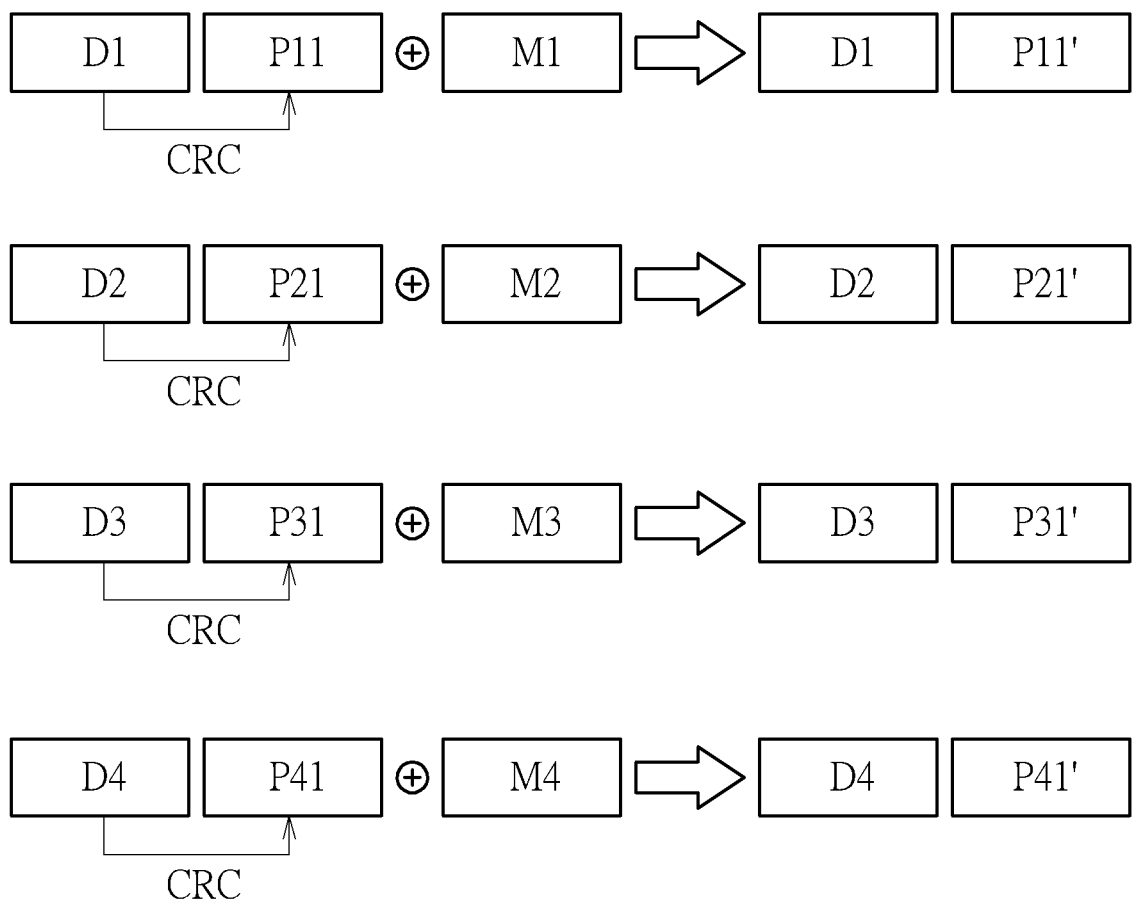
FIG. 7 is a schematic diagram of a CRC operation and an XOR operation according to another embodiment of the present invention.

In the step 606, the first codec 132 performs the CRC operation upon the four portions D1-D4 of the decoded first data to generate another CRC code, and in the step 608, the second codec 134 encodes the another CRC code and the metadata read from the page to generate another adjusted parity code. Specifically, please refer to FIG. 7. The first codec 132 performs the CRC operation upon the four sections D1-D4 of the decoded first data first to generate a plurality of CRC codes P11-P41, wherein the size of each of the CRC codes P11-P41 is 2 bytes. After that, the second codec 134 further performs an exclusive-OR (XOR) operation respectively on the CRC codes P11-P41 and the four portions M1 to M4 of the metadata read from the page to generate adjusted parity codes P11'-P41', respectively.

In the step 610, the microprocessor 112 determines whether the adjusted parity codes P11'-P41' are completely the same as the adjusted parity codes P1'-P4'. If yes, the flow proceeds to the step 612; if not, the flow proceeds to the step 614.

In the step 612, since the adjusted parity codes P11'-P41' are completely the same as the adjusted parity codes P1'-P4', it is possible to ensure the four portions D1-D4 of the first data and the metadata of the first data are correct, and the microprocessor 112 can transmit the four portions D1-D4 of the first data and the corresponding metadata to the host device 130. In addition, in one embodiment, since the contents of the metadata have been confirmed to be correct, the other four portions D5-D8 of the first data can be directly transmitted to the host device 130 together without performing the steps 606-610 again.

In the step 614, since the adjusted parity codes P11'-P41' and the adjusted parity codes P1'-P4' are not exactly the same, then it may be due to an error in the content of the first data or the content of the metadata. Thus, the microprocessor 112 sends back an error message to the host device 130.

Briefly summarized, in the embodiment of the present invention, when the flash memory controller receives a data and a corresponding metadata from a host device, the flash memory controller performs a CRC operation upon the data to generate a CRC code, and encodes the metadata and the CRC code to generate an adjusted parity code with the same number of bits so that the adjusted parity code can be utilized for providing the end to end protection for the data and the metadata. With the embodiments of the present invention, it is not necessary to additionally perform the CRC operation upon the metadata, and no additional data amount is added, so as to save the space of the flash memory as much as possible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory module, comprising:
    using a flash memory controller to receive a data and a corresponding metadata from a host device;
    before the data is stored in a buffer memory of the flash memory controller, performing a cyclic redundancy check (CRC) operation upon the data to generate a CRC code;
    before the data is stored in the buffer memory of the flash memory controller, encoding the metadata and the CRC code to generate an adjusted parity code, wherein a bit number of the adjusted parity code is equal to a bit number of the metadata, and the adjusted parity code combining the metadata and the CRC code is used to protect both the data and the metadata;
    encoding the data and the adjusted parity code to generate encoded data, wherein the encoded data comprises the data, the adjusted parity code and an error correction code corresponding to the data and the adjusted parity code; and
    writing the encoded data and the metadata to a page of a block of the flash memory module.

2. The method of claim 1, wherein the step of encoding the metadata and the CRC code to generate the adjusted parity code comprises:
    performing an exclusive-OR (XOR) operation upon the metadata and the CRC code to generate the adjusted parity code.

3. The method of claim 1, wherein the data comprises a plurality of portions, and the step of performing the CRC operation upon the data to generate a CRC code and encoding the metadata and the CRC code to generate the adjusted parity code comprises:
    respectively performing the CRC operation upon the plurality of portions of the data to generate a plurality of portions of the CRC code;
    dividing the metadata into a plurality of portions; and
    respectively encoding the plurality of portions of the metadata and the plurality of portions of the CRC code to respectively generate a plurality of portions of the adjusted parity code.

4. The method of claim 3, wherein the number of bits in each portion of the metadata is the same as the number of bits in each portion of the CRC code, and step of respectively encoding the plurality of portions of the metadata and the plurality of portions of the CRC code to respectively generate the plurality of portions of the adjusted parity code comprises:
    performing an exclusive-OR (XOR) operation upon the plurality of portions of the metadata and the plurality of portions of the CRC code to generate the plurality of portions of the adjusted parity code.

5. The method of claim 1, further comprising:
    reading the encoded data and the metadata from the page according to a read request of the host device;
    decoding the encoded data to generate the data and the adjusted parity code;
    performing the CRC operation upon the data to generate another CRC code;
    encoding the another CRC code and the metadata read from the page to generate another adjusted parity code; and
    comparing the adjusted parity code and the another parity code to determine whether there is any error in the metadata stored in the page.

6. The method of claim 5, further comprising:
    when contents of the adjusted parity code and the other adjusted parity code are not completely the same, determining there is an error in the metadata stored in the page, and transmitting an error message back to the host device; and
    when contents of the adjusted parity code and the other adjusted parity code are completely the same, determining the metadata stored in the page is correct, and transmitting the data and the metadata back to the host device.

7. The method of claim 1, wherein the metadata comprises identification information, hash data, or Quality of Service (QoS) information of the data.

8. A flash memory controller, wherein the flash memory controller is utilized to access a flash memory module, and the flash memory controller comprises:
- a read-only memory (ROM), for storing a code;
- a microprocessor, for executing the code to control access to the flash memory module; and
- a plurality of codecs;
- wherein when the flash memory controller receives a data and a corresponding metadata from a host device, before the data is stored in a buffer memory of the flash memory controller, the plurality of codecs perform a CRC operation upon the data to generate a CRC code, and encodes the metadata and the CRC code to generate an adjusted parity code, wherein a bit number of the adjusted parity code is equal to a bit number of the metadata, and the adjusted parity code combining the metadata and the CRC code is used to protect both the data and the metadata; and encodes the data and the adjusted parity code to generate encoded data, wherein the encoded data comprises the data, the adjusted parity code and an error correction code corresponding to the data and the adjusted parity code; and the microprocessor writes the encoded data and the metadata to a page of a block of the flash memory module.

9. The flash memory controller of claim 8, wherein the plurality of codecs perform an exclusive-OR (XOR) operation on the metadata and the CRC code to generate the adjusted parity code.

10. The flash memory controller of claim 8, wherein the data comprises a plurality of portions, and the plurality of codecs respectively perform the CRC operation on the plurality of portions of the data to generate a plurality of portions of the CRC code, and divide the metadata into a plurality of portions to respectively encode the plurality of portions of the metadata and the plurality of portions of the CRC code to respectively generate a plurality of portions of the adjusted parity code.

11. The flash memory controller of claim 10, wherein the number of bits in each portion of the metadata is the same as the number of bits in each portion of the CRC code, and the plurality of codecs respectively perform an exclusive-OR (XOR) operation on the plurality of portions of the metadata and the plurality of portions of the CRC code to generate the plurality of portions of the adjusted parity code.

12. The flash memory controller of claim 8, wherein the microprocessor reads the encoded data and the metadata from the page according to a read request of the host device, and the plurality of codecs decode the encoded data to generate the data and the adjusted parity code to perform the CRC operation upon the data to generate another CRC code, and encode the another CRC code and the metadata read from the page to generate another adjusted parity code, and the microprocessor compares the adjusted parity code and the another parity code to determine whether there is any error in the metadata stored in the page.

13. The flash memory controller of claim 12, wherein when contents of the adjusted parity code and the other adjusted parity code are not completely the same, the microprocessor determines there is an error in the metadata stored in the page, and transmitting an error message back to the host device; and when contents of the adjusted parity code and the other adjusted parity code are completely the same, the microprocessor determines the metadata stored in the page is correct, and transmitting the data and the metadata back to the host device.

14. The flash memory controller of claim 8, wherein the metadata comprises identification information, hash data, or Quality of Service (QoS) information of the data.

15. An electronic device comprises:
- a flash memory module; and
- a flash memory controller, for accessing the flash memory module;
- wherein when the flash memory controller receives a data and a corresponding metadata from a host device, before the data is stored in a buffer memory of the flash memory controller, the flash memory controller performs a CRC operation upon the data to generate a CRC code, and encodes the metadata and the CRC code to generate an adjusted parity code, wherein a bit number of the adjusted parity code is equal to a bit number of the metadata, and the adjusted parity code combining the metadata and the CRC code is used to protect both the data and the metadata; and encodes the data and the adjusted parity code to generate encoded data, wherein the encoded data comprises the data, the adjusted parity code and an error correction code corresponding to the data and the adjusted parity code; and the microprocessor writes the encoded data and the metadata to a page of a block of the flash memory module.

16. The electronic device of claim 15, wherein the flash memory controller performs an exclusive-OR (XOR) operation on the metadata and the CRC code to generate the adjusted parity code.

17. The electronic device of claim 15, wherein the data comprises a plurality of portions, and the flash memory controller respectively performs the CRC operation on the plurality of portions of the data to generate a plurality of portions of the CRC code, and divides the metadata into a plurality of portions to respectively encode the plurality of portions of the metadata and the plurality of portions of the CRC code to respectively generate a plurality of portions of the adjusted parity code.

18. The electronic device of claim 17, wherein the number of bits in each portion of the metadata is the same as the number of bits in each portion of the CRC code, and the flash memory controller performs an exclusive-OR (XOR) operation respectively on the plurality of portions of the metadata and the plurality of portions of the CRC code to generate the plurality of portions of the adjusted parity code.

19. The electronic device of claim 15, wherein the flash memory controller reads the encoded data and the metadata from the page according to a read request of the host device, and the flash memory controller decodes the encoded data to generate the data and the adjusted parity code to perform the CRC operation upon the data to generate another CRC code, and encodes the another CRC code and the metadata read from the page to generate another adjusted parity code, and the flash memory controller compares the adjusted parity code and the another parity code to determine whether there is any error in the metadata stored in the page.

20. The electronic device of claim 19, wherein when contents of the adjusted parity code and the other adjusted parity code are not completely the same, the flash memory controller determines there is an error in the metadata stored in the page, and transmitting an error message back to the host device; and when contents of the adjusted parity code and the other adjusted parity code are completely the same, the flash memory controller determines the metadata stored in the page is correct, and transmitting the data and the metadata back to the host device.

\* \* \* \* \*